United States Patent
Immel

[11] Patent Number: 5,090,476
[45] Date of Patent: Feb. 25, 1992

[54] AIR-WATER HEAT EXCHANGER FOR A CONTROL BOX

[75] Inventor: Manfred Immel, Mittenaar-Bicken, Fed. Rep. of Germany

[73] Assignee: Rittal-Werk Rudolf Loh GmbH & Co. KG, Fed. Rep. of Germany

[21] Appl. No.: 672,536

[22] Filed: Mar. 20, 1991

[30] Foreign Application Priority Data

Mar. 20, 1990 [DE] Fed. Rep. of Germany ....... 4008838

[51] Int. Cl.⁵ .................... F25D 21/14; F28F 17/00
[52] U.S. Cl. ................... 165/122; 62/285; 62/288; 62/150
[58] Field of Search .......... 62/160, 288, 285; 165/122

[56] References Cited

U.S. PATENT DOCUMENTS

| | | | |
|---|---|---|---|
| 3,214,933 | 11/1965 | Morton | 62/150 |
| 3,299,660 | 1/1967 | Sullivan | 62/285 |
| 3,596,475 | 8/1971 | Berger | 62/285 |
| 3,724,233 | 4/1973 | Pugh et al. | 62/288 |
| 3,823,768 | 7/1974 | Finger | 165/122 |
| 4,348,870 | 9/1982 | Stein et al. | 62/150 |
| 4,416,327 | 11/1983 | Nakada et al. | 165/122 |
| 4,475,359 | 10/1984 | Sano | 62/150 |
| 4,633,673 | 1/1987 | Morrison et al. | 62/150 |

FOREIGN PATENT DOCUMENTS

| | | |
|---|---|---|
| 2006759 | 2/1970 | Fed. Rep. of Germany. |
| 3602489 | 1/1986 | Fed. Rep. of Germany. |
| 3710566 | 3/1987 | Fed. Rep. of Germany. |
| 3714727 | 5/1987 | Fed. Rep. of Germany. |
| 4738 | 1/1985 | Japan ............. 62/288 |

Primary Examiner—John Rivell
Assistant Examiner—L. R. Leo
Attorney, Agent, or Firm—Speckman & Pauley

[57] ABSTRACT

This invention relates to an air-water heat exchanger with an exchanger unit and a blower contained in a housing, which can be placed on the cover of a control box or the like and which is provided on the side facing the cover with an inlet and an outlet opening, which are aligned with corresponding openings in the cover of the control box or the like. By a particular routing of the air in the area of the inlet and outlet openings of the exchanger unit, even in case of leakage of the exchanger unit, no water can come out of the inlet and/or outlet openings and reach the control box or the like.

22 Claims, 2 Drawing Sheets

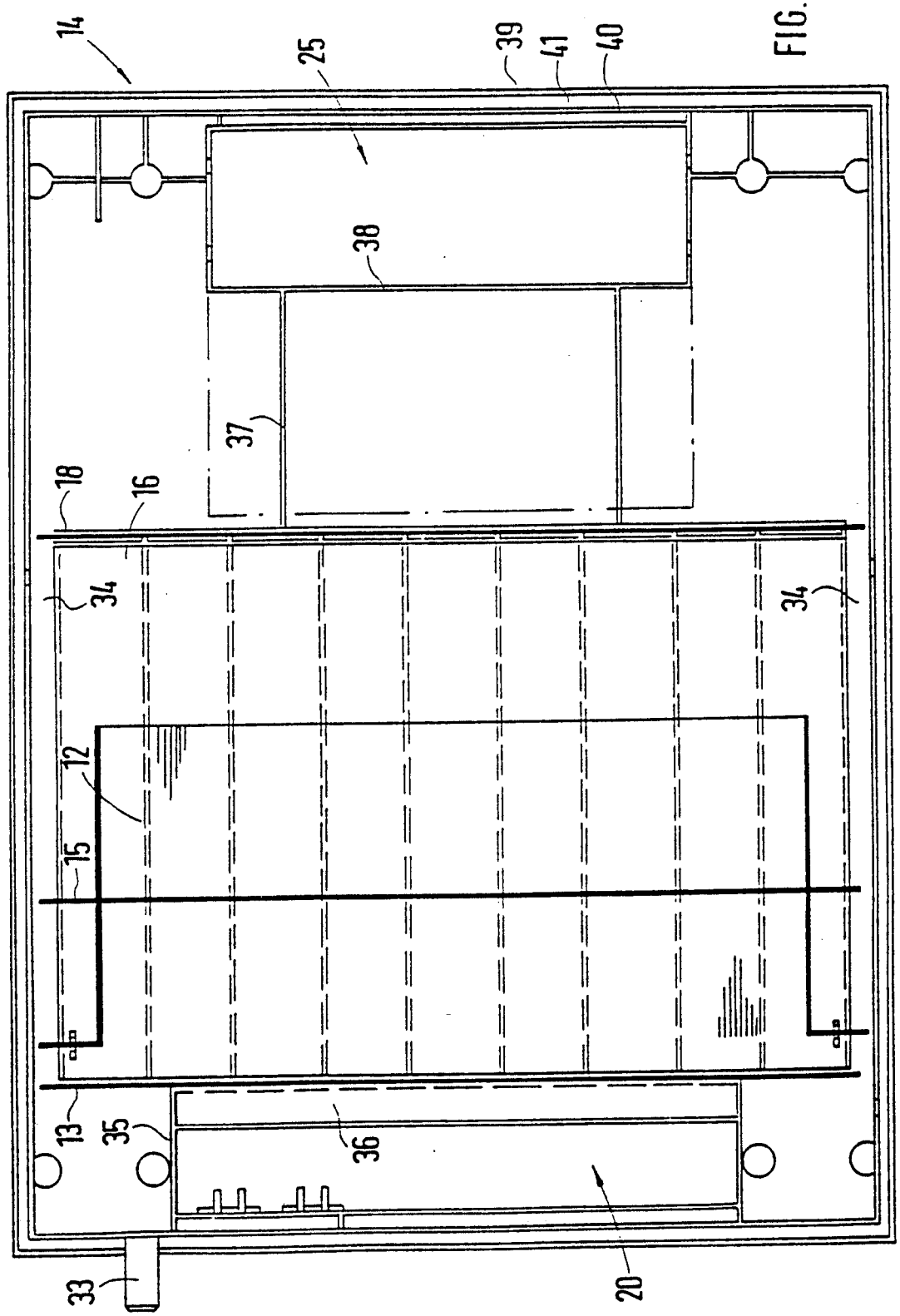

AIR-WATER HEAT EXCHANGER FOR A CONTROL BOX

BACKGROUND OF THE INVENTION

1. Field of the Invention

This invention relates to an air-water heat exchanger having an exchanger unit and a blower contained in a housing, which can be placed on the cover of a control box and which is provided on the side facing the cover with openings which are aligned with corresponding openings in the cover of the control box.

2. Description of the Prior Art

When an air-water heat exchanger is installed on top of a control box, the danger exists that, in the case of a leak in the exchanger unit, water can reach the interior of the control box through the openings in the cover of the control box causing short circuits or other damage to the built-in electrical devices.

Heat exchangers of the type mentioned above are disclosed by German Published, Non-Examined Patent Application DE-OS 20 06 759. The warm air inside the control box is removed by means of the blower and is directed over the exchanger unit, by which it is cooled and returned to the control box through the blower. Cooling is accomplished by colder outside air which is circulated through the heat exchanger. However, the efficiency of the exchanger unit is low.

German Patent DE 37 14 727 A1 discloses catching the condensation water of an air conditioner unit in a collecting tub and discarding it.

German Patent DE 37 10 566 C2 discloses a heat exchanger unit with an inlet opening and a separate outlet opening surrounded by a collar into which an outlet connector has been inserted.

German Patent DE 36 02 489 A1 discloses a monitor device for determining leaks in an air conditioner unit of a control box.

SUMMARY OF THE INVENTION

It is the object of this invention to provide an air-water heat exchanger of the type previously mentioned in which, even with splashing water coming from the exchanger unit, no water can reach the inside of the control box.

In accordance with one embodiment of this invention, this object is attained by an exchanger unit placed into a collecting tub in which a fill level and/or temperature sensor is disposed. In the area above the exchanger unit, a separating wall in the housing separates an inlet chamber from an outlet chamber. The inlet chamber has an inlet conduit starting at an inlet opening which is separated from the inlet side of the exchanger unit by a first deflection piece and is only connected with the inlet side of the exchanger unit through an inflow opening located above the exchanger unit. In the outlet chamber, second and third deflection pieces separate an outlet conduit coming from the outlet side of the exchanger unit, which outlet conduit is connected above the exchanger unit through an outflow opening with the remaining space of the outlet chamber. A blower is positioned in the remaining space of the outlet chamber and its outlet connector changes into an outlet opening.

The deflection pieces cover, in combination with the separating wall, the exchanger unit in such a way that the inlet and the outlet sides of the exchanger unit are only connected through the inflow and outflow openings with the inlet and outlet chambers. Because they are located above the exchanger unit, even splashing water which could come out of a defective exchanger unit is returned to the collecting tub underneath the exchanger unit. The collecting tub is provided with a sensor which can react to increased temperature and/or to a preset water level in the collecting tub. The signal of the sensor can be used for sounding an alarm and for shutting down the blower and turning off the water supply. The air-water heat exchanger designed in this manner provides sufficient assurance that water cannot exit by means of the inlet and the outlet openings and reach the control box or the like. Therefore, the air-water heat exchanger in accordance with this invention can be placed on top of a control box or the like without hesitation.

In accordance with one embodiment of this invention, the division of the two chambers in the housing is provided by a separating wall connected with the exchanger unit approximately in the center of the top of the exchanger unit and extending up to the housing, which is in the shape of a covering hood.

In accordance with another embodiment of this invention, the covering of the inlet side of the exchanger unit is provided by a first deflection piece disposed at a distance from and approximately parallel to the inlet side of the exchanger unit. The first deflection piece extends above the top of the exchanger unit and, while keeping the inflow opening free by beveled edges, approaches the separating wall at a distance from the exchanger unit. The first deflection piece, together with the facing side wall of the housing, forms the inlet conduit to the inlet chamber. In a preferred embodiment of this invention, the inlet opening is defined by a circumferential collar of the collecting tub, which extends into the housing. A drip pan of the collecting tub, the bottom of which rises in the direction of the blower, together with a side wall forms the collar of the inlet opening. The first deflection piece is inserted underneath the exchanger unit into the drip pan, which has been drawn up into the housing, and is connected with the side wall of the collar. The rising bottom of the drip pan prevents any water from reaching the outlet conduit while there is underpressure in this area.

In accordance with an embodiment of this invention, the collecting tub is designed to close the open side of the hood-like housing except for the inlet and outlet openings. As a result, leaks from the supply lines and the drain lines to and from the exchanger unit are also caught.

The covering of the outlet side of the exchanger unit in accordance with an embodiment of this invention is provided by a second deflection piece disposed at a distance from and approximately parallel to the outlet side of the exchanger unit in the collecting tub. The second deflection piece extends above the top of the exchanger unit and while maintaining the outflow opening free by beveled edges, approaches the separating wall at a distance from the exchanger unit. The upper area of the outlet side of the exchanger unit is partially covered by means of a third deflection piece which extends obliquely, and which together with a section of the second deflection piece, forms the outlet conduit into the outlet chamber. The third deflection piece ends at a distance from the second deflection piece and provides an entry opening into the outlet conduit.

To increase safety, the collecting tub is provided with a runoff connector extending from a circumferential edge of the collecting tub and leading out of the housing so that the water collected by the entire collecting tub can be removed.

The transition between the outlet opening and the interior chamber of the housing is a collar, drawn upwards on the collecting tub and extending into the housing, forming the border of the outlet opening. The outlet connector of the blower is inserted into the collar.

The tight seal between the housing and the collecting tub is achieved in accordance with one embodiment of this invention where the collecting tub is lengthened beyond the circumferential edge and with an upright sealing edge forms a receptacle for a sealing element, on which the front face of the hood-like housing is tightly supported.

So that the water caught by the collecting tub outside of the drip pan can reach the runoff connector, the drip pan of the collecting tub is only disposed underneath the exchanger unit. As a result, runoff channels are created on both sides in the direction of the edge of the collecting tub, which are connected with the runoff connector outside of the collars for the inlet and outlet openings.

If the first and the second deflection pieces are disposed at a distance from the side walls of the housing and, at least in the area of the runoff channels, do not extend to the collecting tub, then these deflection pieces also do not hamper the runoff of water from the collecting tub.

The invention will be described in detail by means of an exemplary embodiment shown in the drawings.

BRIEF DESCRIPTION OF THE DRAWINGS

FIG. 2 is a top view on the side of the collecting tub facing the housing, which closes the open side of the hood-like housing.

DESCRIPTION OF PREFERRED EMBODIMENTS

Figure 1:
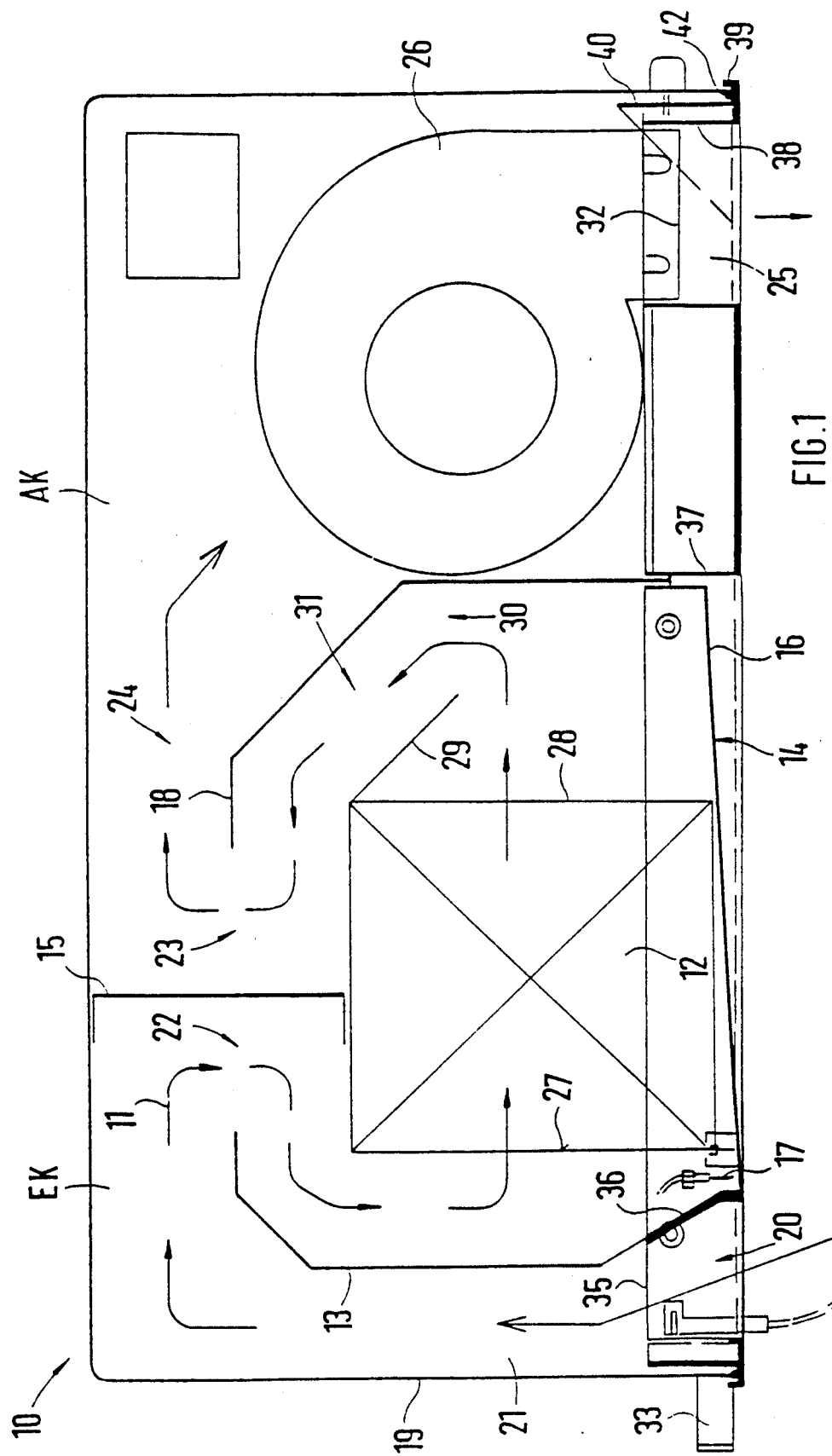
FIG. 1 is a schematic longitudinal section of the structure of the air-water heat exchanger in accordance with one embodiment of this invention.

The air-water heat exchanger in accordance with FIG. 1 has a hood-like housing 19, the open underside of which is covered by means of the collecting tub 14. Collecting tub 14 leaves the inlet opening 20 and the outlet opening 25 free, having drawn up collars 35 and 38 forming the borders of these openings. The collecting tub 14 has a drawn up drip pan 16 with a bottom which rises in the direction towards the blower 26, which receives the exchanger unit 12. The inlet side 27 and the outlet side 28 of the exchanger unit are located opposite each other. The exchanger unit 12 is connected in a known manner by a supply line and a drain line and is supplied with water. The air to be cooled is supplied to the inlet side 27 and cooled and discharged on the outlet side 28, the blower 26 accelerating the circulation of the air.

The sealing element 42, on which the front face of the hood-like housing 19 is tightly supported, is received in the receptacle 41 on the edge of the collecting tub 14 between the drawn up edge 40 and the shorter sealing edge 39. The warm air is drawn out of the control box or the like through the inlet opening 20. The collar 35 of the collecting tub 14 forms the border of the inlet opening 20. The separating wall 15, the free end of which extends as far as the inside of the housing 19, is fastened on the top of the exchanger unit 12. The separating wall 15 divides the interior chamber of the housing above the exchanger unit 12 into the inlet chamber EK and the outlet chamber AK. As shown by the air guide 11 in the inlet chamber EK, the aspirated warm air is not routed directly to the inlet side 27 of the exchanger unit 12, but rather is drawn upwards through the inlet conduit 21 and is only routed downward again above the exchanger unit 12 to the inlet side 27 through the inflow opening 22. The inlet conduit 21 is divided by first deflection piece 13, which is disposed at a distance from and approximately parallel to the inlet side 27 of the exchanger unit 12 and connected with the side wall 36 of the collar 35 of the collecting tub. The first deflection piece 13 extends above the top of the exchanger unit 12, is beveled at a distance from the latter in the direction towards the separating wall 15 and leaves the inflow opening 22 free towards the separating wall 15. As a result, the inlet side 27 of the exchanger unit 12 is covered in such a way that even splashing water, which would exit in the area of the inlet chamber EK in case of a leak in the exchanger unit 12, is safely conducted into the drip pan 16 of the collecting tub 14. A fill level and/or temperature sensor 17 is disposed in the drip pan 16 of the collecting tub 14 and is activated when the water level is too high and/or the temperature inside the air-water heat exchanger 10 is too high, triggering an alarm signal or initiating switching operations for shutting down the blower 26 or the water supply.

The outlet side 28 of the exchanger unit 12 is protected in a similar fashion to the inlet side 27. A second deflection piece 18 is located at a distance from and approximately parallel to the outlet side 28 of the exchanger unit 12. It is led over the top of the exchanger unit 12 and is beveled at a distance from the latter in the direction of the separating wall 15. The outflow opening 23 remains free in the direction towards the separating wall 15. A third deflection piece 29 has been fastened, obliquely extending downward, to the top of the outlet side 28 of the exchanger unit 12, so that the upper area of the outlet side 28 is partially covered.

The third deflection piece 29 forms, together with the second deflection piece 18, the entry opening 30 to the outlet conduit 31 as well as the outlet conduit 31 itself.

The transition 24 into the remaining space of the outlet chamber AK, in which the blower 26 is disposed, is created between the second deflection piece 18 and the housing 19. The outlet connector 32 of the blower 26 has been inserted into the collar 38 which forms the border of the outlet opening 25 of the air-water heat exchanger 10. Should a leak occur in the exchanger unit 12 in the area of the outlet chamber AK, because of the higher placed outflow opening 23, no water can reach the chamber with the blower 26 and through it the outlet opening 25.

Outside of the collar 35, the collecting tub 14 has been provided with the runoff connector 33, which starts at the edge 40 and preferably extends out of the housing 19. It can be used as a connection to a runoff line. The condensing water normally collecting in the drip pan 16 of the collecting tub 14 is discarded through the runoff connector 33.

So that the water collecting in the entire area of the collecting tub 14 can reach the runoff connector 33, the drip pan 16 underneath the exchanger unit 12 does not extend as far as the edge 40. As a result, runoff channels 34 remain on both sides of the exchanger unit 12, as shown in FIG. 2. These runoff channels 34 are located at the level of the collecting tub 14, so that even with leaks in the lines in the area of the supply line and drain line for the water, no water can reach the inlet and outlet openings 20 and 25 protected by the collars 35 and 38. The deflection pieces 13 and 18 do not extend as far as the side walls of the housing 19 and the bottom of the collecting tub 14, so that they do not hamper the runoff of water, especially in the areas of the runoff channels 34.

The drip pan 16 and the collars 35 and 38 may be made of one piece with the collecting tub 14 or be connected with the collecting tub 14 as separate pieces. The same holds true for the collar 37 which has one wall in common with the collar 38 and is disposed below the blower 26.

FIG. 2 also shows that sufficient space for placement of lines remains next to the drip pan 16 and the collars 35, 37 and 38. In addition, FIG. 1 shows that the side of the drip pan 16 facing the inlet opening 20 makes a transition into the bottom of the collecting tub 14, so that no water can collect in the drip pan 16. Also, FIG. 1 shows the tight seal of the air-water heat exchanger 10 between the housing 19 and the collecting tub 14. The front of the housing 19 is tightly supported on the circumferential sealing element 42, which has been inserted, outside of the circumferential edge 40, into the receptacle 41, which is bordered towards the outside by the sealing edge 39.

I CLAIM

1. In an air-water heat exchanger with an exchanger unit and a blower contained in a housing, placed on a cover of a control box and provided on a side facing said cover with a plurality of exchanger openings which are aligned with corresponding cover openings of said cover of said control box, the improvement comprising:
   said exchanger unit (12) positioned in a collecting tub (14) in which at least one of a fill level sensor and temperature sensor (17) is disposed;
   in an area above said exchanger unit (12), a separating wall (15) in said housing (19) separating an inlet chamber (EK) from an outlet chamber (AK);
   in said inlet chamber (EK), an inlet conduit (21), starting at an inlet opening (20), separated from an inlet side (27) of said exchanger unit (12) by a first deflection piece (13) and only connected with said inlet side (27) of said exchanger unit (12) through an inflow opening (22) located above said exchanger unit (12);
   in said outlet chamber (AK), second and third deflection pieces (18, 29) forming an outlet conduit (31) coming from an outlet side (28) of the exchanger unit (12), which is connected above said exchanger unit (12) through an outflow opening (23) with a remaining space of said outlet chamber (AK); and
   said blower (26) disposed in said remaining space of said outlet chamber (AK) and having an outlet connector (32) changing into an outlet opening (25).

2. An air-water heat exchanger in accordance with claim 1, wherein said separating wall (15) is connected to said exchanger unit (12) approximately in a center of a top of said exchanger unit (12) and extends to said housing (19), which is in a shape of a covering hood.

3. An air-water heat exchanger in accordance with claim 1, wherein said first deflection piece (13) is disposed at a first inlet side distance from and approximately parallel to said inlet side (27) of said exchanger unit (12), extends above a top of said exchanger unit (12) and, while maintaining said inflow opening (22) free by an inlet beveled edge, approaches said separating wall (15) at a second inlet side distance from the exchanger unit (12), and
   together with a facing side wall of said housing (19), forms said inlet conduit (21) to said inlet chamber (EK).

4. An air-water heat exchanger in accordance with claim 1, wherein a circumferential inlet collar (35) of said collecting tub (14), which extends into said housing (19), defines said inlet opening (20),
   a drip pan (16) of said collecting tub (14), a bottom of which rises toward said blower (26), forms together with a circumferential side wall (36) said circumferential inlet collar (35) of said inlet opening (20), and
   said first deflection piece (13) is inserted underneath said exchanger unit (12) into said drip pan (16), which has been drawn up into said housing (19), and is connected with said circumferential side wall (36) of said circumferential inlet collar (35).

5. An air-water heat exchanger in accordance with claim 1, wherein said collecting tub (14) closes an open side of said housing (19) except for said inlet opening (20) and said outlet opening (25).

6. An air-water heat exchanger in accordance with claim 1, wherein said second deflection piece (18) is disposed at a first outlet side distance from and approximately parallel to said outlet side (28) of said exchanger unit (12) in said collecting tub (14), extends above said top of said exchanger unit (12) and, while maintaining said outflow opening (23) free by an outlet beveled edge, approaches said separating wall (15) at a second outlet side distance from said exchanger unit (12),
   an exchanger upper area of said outlet side (28) of said exchanger unit (12) is partially covered by said third deflection piece (29) which extends obliquely, and
   said third deflection piece (29), together with a section of said second deflection piece (18), forms said outlet conduit (31) into said outlet chamber (AK).

7. An air-water heat exchanger in accordance with claim 6, wherein said third deflection piece (29) terminates at a third outlet side distance from said second deflection piece (18) and forms an entry opening (30) into said outlet conduit (31).

8. An air-water heat exchanger in accordance with claim 1, wherein said collecting tub (14) is in communication with a runoff connector (33) leading out of said housing (19).

9. An air-water heat exchanger in accordance with claim 1, wherein a circumferential outlet collar (38), drawn upwards on said collecting tub (14) and extending into said housing (19), forms a border of said outlet opening (25), and
   said outlet connector (32) of said blower (26) is inserted into said circumferential outlet collar (38).

10. An air-water heat exchanger in accordance with claim 1, wherein said collecting tub (14) extends beyond a circumferential edge (40) and forms with an upright sealing edge (39) a receptacle (41) for a sealing element (42), on which a front face of said housing (19) is tightly supported.

11. An air-water heat exchanger in accordance with claim 1, wherein said drip pan (16) of said collecting tub (14) is disposed only underneath said exchanger unit (12), forming a runoff channel (34) on both sides of said exchanger unit in a direction of a circumferential edge (40) of said collecting tub (14), which is connected with a runoff connector (33) outside o said circumferential inlet collar (35) and said circumferential outlet collar (38) for said inlet and outlet openings (20, 25), respectively.

12. An air-water heat exchanger in accordance with claim 1, wherein said first and said second deflection pieces (13, 18) are disposed at a distance from a plurality of side walls of said housing (19) and, at least in an area of a runoff channel (34), do not extend to said collecting tub (14).

13. An air-water heat exchanger in accordance with claim 2, wherein said first deflection piece (13) is disposed at a first inlet side distance from and approximately parallel to said inlet side (27) of said exchanger unit (12), extends above a top of said exchanger unit (12) and, while maintaining said inflow opening (22) free by an inlet beveled edge, approaches said separating wall (15) at a second inlet side distance from the exchanger unit (12), and together with a facing side wall of said housing (19), forms said inlet conduit (21) to said inlet chamber (EK).

14. An air-water heat exchanger in accordance with claim 13, wherein a circumferential inlet collar (35) of said collecting tub (14), which extends into said housing (19), defines said inlet opening (20), a drip pan (16) of said collecting tub (14), a bottom of which rises toward said blower (26), forms together with a circumferential side wall (36) said circumferential inlet collar (35) of said inlet opening (20), and said first deflection piece (13) is inserted underneath said exchanger unit (12) into said drip pan (16), which has been drawn up into said housing (19), and is connected with said circumferential side wall (36) of said circumferential inlet collar (35).

15. An air-water heat exchanger in accordance with claim 14, wherein said collecting tub (14) closes an open side of said housing (19) except for said inlet opening (20) and said outlet opening (25).

16. An air-water heat exchanger in accordance with claim 15, wherein said second deflection piece (18) is disposed at a first outlet side distance from and approximately parallel to said outlet side (28) of said exchanger unit (12) in said collecting tub (14), extends above said top of said exchanger unit (12) and, while maintaining said outflow opening (23) free by an outlet beveled edge, approaches said separating wall (15) at a second outlet side distance from said exchanger unit (12), an exchanger upper area of said outlet side (28) of said exchanger unit (12) is partially covered by said third deflection piece (29) which extends obliquely, and said third deflection piece (29), together with a section of said second deflection piece (18), forms said outlet conduit (31) into said outlet chamber (AK).

17. An air-water heat exchanger in accordance with claim 16, wherein said third deflection piece (29) terminates at a third outlet side distance from said second deflection piece (18) and forms an entry opening (30) into said outlet conduit (31).

18. An air-water heat exchanger in accordance with claim 17, wherein said collecting tub (14) is in communication with a runoff connector (33) leading out of said housing (19).

19. An air-water heat exchanger in accordance with claim 18, wherein a circumferential outlet collar (38), drawn upwards on said collecting tub (14) and extending into said housing (19), forms a border of said outlet opening (25), and said outlet connector (32) of said blower (26) is inserted into said circumferential outlet collar (38).

20. An air-water heat exchanger in accordance with claim 19, wherein said collecting tub (14) extends beyond a circumferential edge (40) and forms with an upright sealing edge (39) a receptacle (41) for a sealing element (42), on which a front face of said housing (19) is tightly supported.

21. An air-water heat exchanger in accordance with claim 20, wherein said drip pan (16) of said collecting tub (14) is disposed only underneath said exchanger unit (12), forming a runoff channel (34) on both sides of said exchanger unit in a direction of said circumferential edge (40) of said collecting tub (14), which is connected with said runoff connector (33) outside of said circumferential inlet collar (35) and said circumferential outlet collar (38) for said inlet and outlet openings (20, 25), respectively.

22. An air-water heat exchanger in accordance with claim 21, wherein said first and said second deflection pieces (13, 18) are disposed at a distance from a plurality of side walls of said housing (19) and, at least in an area of said runoff channel (34), do not extend to said collecting tub (14).

* * * * *